United States Patent
Yang

(10) Patent No.: US 11,776,643 B2
(45) Date of Patent: Oct. 3, 2023

(54) SYSTEMS AND METHODS FOR DISTRIBUTING PROGRAMMING SPEED AMONG BLOCKS WITH DIFFERENT PROGRAM-ERASE CYCLE COUNTS

(71) Applicant: SanDisk Technologies LLC, Addison, TX (US)

(72) Inventor: Xiang Yang, Santa Clara, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/337,758

(22) Filed: Jun. 3, 2021

(65) Prior Publication Data

US 2022/0392556 A1 Dec. 8, 2022

(51) Int. Cl.
*G11C 16/10* (2006.01)
*G11C 16/34* (2006.01)
*G11C 16/16* (2006.01)
*G11C 16/30* (2006.01)
*G11C 16/24* (2006.01)
*G11C 16/08* (2006.01)
*G11C 16/26* (2006.01)

(52) U.S. Cl.
CPC .......... *G11C 16/3495* (2013.01); *G11C 16/08* (2013.01); *G11C 16/10* (2013.01); *G11C 16/102* (2013.01); *G11C 16/16* (2013.01); *G11C 16/24* (2013.01); *G11C 16/26* (2013.01); *G11C 16/30* (2013.01)

(58) Field of Classification Search
CPC ... G11C 16/3495; G11C 16/08; G11C 16/102; G11C 16/16; G11C 16/24; G11C 16/26; G11C 16/30; G11C 16/10; G11C 16/3459; G11C 16/32
See application file for complete search history.

(56) References Cited

U.S. PATENT DOCUMENTS

2007/0242524 A1* 10/2007 Hemink ............. G11C 16/3418
                                                          365/185.24
2010/0246265 A1*  9/2010 Moschiano ......... G11C 11/5635
                                                          365/185.11

(Continued)

*Primary Examiner* — Jay W. Radke
(74) *Attorney, Agent, or Firm* — DICKINSON WRIGHT PLLC; Steven C. Hurles

(57) ABSTRACT

Non-volatile memory systems and method for managing P/E cycling is disclosed. Memory systems include multi-plane (e.g., 2-plane or 4-plane) programming operations in which new blocks within a plane replace faulty/bad blocks. Existing blocks, having undergone several P/E cycles more than the new block(s), require a lower programming voltage and are programmed using an adaptive (reduced) programming voltage. New block(s) require an additional voltage, and a delta voltage is added to the programming voltage to increase the gate-to-channel voltage. To prevent the delta voltage from over-programming the existing blocks, a voltage equal to the delta voltage is applied bit lines of the existing blocks, thereby reducing the effective gate-to-channel voltage on the existing blocks. In this manner, the same programming voltage is applied to planes in a multi-plane programming operation, and the existing blocks receive a relatively lower gate-to-channel voltage, while the new block(s) receive a relatively higher gate-to-channel voltage.

18 Claims, 13 Drawing Sheets

750

| Cycle # | Bit line voltage | | WL Program voltage |
|---|---|---|---|
| | Regular blocks | Re-linked block (Δ) | |
| 0 | 0 V | 0 V | |
| 10000 | 0 V | 0.1 V | |
| 20000 | 0 V | 0.2 V | |
| 30000 | 0 V | 0.3 V | |
| 40000 | 0 V | 0.4 V | |
| 50000 | 0 V | 0.5 V | $V_{PGM} + \Delta V$ |
| 60000 | 0 V | 0.6 V | |
| 70000 | 0 V | 0.7 V | |
| 80000 | 0 V | 0.8 V | |
| 90000 | 0 V | 0.9 V | |
| 100000 | 0 V | 1.0 V | |

(56) References Cited

U.S. PATENT DOCUMENTS

| | | | |
|---|---|---|---|
| 2015/0186055 A1* | 7/2015 | Darragh | G11C 16/3445 |
| | | | 711/103 |
| 2015/0186072 A1* | 7/2015 | Darragh | G06F 3/0679 |
| | | | 711/103 |
| 2016/0085455 A1* | 3/2016 | Cohen | G06F 3/0611 |
| | | | 711/103 |
| 2018/0293003 A1* | 10/2018 | Muchherla | G11C 16/3495 |
| 2021/0089394 A1* | 3/2021 | Yu | G06F 11/1068 |
| 2021/0264982 A1* | 8/2021 | Li | G11C 16/08 |

* cited by examiner

750

| Cycle # | Bit line voltage | | WL Program voltage |
|---|---|---|---|
| | Regular blocks | Re-linked block (Δ) | |
| 0 | 0 V | 0 V | $V_{PGM} + \Delta V$ |
| 10000 | 0 V | 0.1 V | |
| 20000 | 0 V | 0.2 V | |
| 30000 | 0 V | 0.3 V | |
| 40000 | 0 V | 0.4 V | |
| 50000 | 0 V | 0.5 V | |
| 60000 | 0 V | 0.6 V | |
| 70000 | 0 V | 0.7 V | |
| 80000 | 0 V | 0.8 V | |
| 90000 | 0 V | 0.9 V | |
| 100000 | 0 V | 1.0 V | |

FIG. 11

SYSTEMS AND METHODS FOR DISTRIBUTING PROGRAMMING SPEED AMONG BLOCKS WITH DIFFERENT PROGRAM-ERASE CYCLE COUNTS

TECHNICAL FIELD

This disclosure relates to non-volatile memory storage systems in solid-state drives or other devices, including but not limited to flash drives or embedded/removable flash packages. More specifically, this disclosure relates to systems and methods for managing program-erase cycles for blocks (and their associated features) on different planes but store information using multi-plane programming that links blocks (on different planes) together. Moreover, using multi-plane technology, faulty blocks can be replaced by and linked with new/fresh blocks, and as a result, at least some blocks have undergone a different number of program-erase cycles.

BACKGROUND

Semiconductor memory is widely used in various electronic devices such as cellular telephones, digital cameras, personal digital assistants, medical electronics, mobile computing devices, and non-mobile computing devices. Semiconductor memory may include non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and electrically erasable programmable read-only memory (EEPROM).

In current NAND technology, programming speed is a function of program-erase (P/E) cycles. For example, programming speed increases with increasing P/E cycles. This is due in part to additional trapped electrons inside the dielectric barrier (e.g., tunnel oxide or near tunnel oxide barrier). Over time, these trapped electrons can systematically shift up threshold voltage (VT). Accordingly, applying the same programming voltage ($V_{PGM}$) can cause over-programming of the NAND memory cells. One solution is to incorporate adaptive $V_{PGM}$, which gradually reduces $V_{PGM}$ as P/E cycle counts increase. Adaptive $V_{PGM}$ can effectively compensate, or even offset, increasing programming speed issues.

While adaptive $V_{PGM}$ can overcome some issues, adaptive $V_{PGM}$ may be insufficient to overcome others. For example, multi-plane programming can use one page per plane to store information. In some instances, a controller (e.g., SSD controller) can detect a faulty, or bad, block, and replace the faulty block with a new, or fresh, block. As a result, a disparate number of P/E cycles may exist between the existing blocks in the multi-plane program and the new block, and a corresponding difference in VT. In this regard, the existing blocks, having undergone additional P/E cycles, are subject to a lower programming voltage due to adaptive $V_{PGM}$. Although adaptive $V_{PGM}$ is sufficient for programming the existing blocks, adaptive $V_{PGM}$ can be insufficient in programming the new block, thereby under-programming the new block. Accordingly, the new block may require an additional programming loop, which is inefficient.

SUMMARY

Various embodiments are described herein for applying a programming voltage to a multi-plane programming operation in which the programming voltage that effectively differs based on the number of program nonvolatile memory, e.g., a NAND, or the like. A memory can include a memory control circuitry and memory cells to store data.

An aspect of the present disclosure is related to a method for performing a programming operation to a multi-plane programming system that includes the steps of receiving, at a first word line of a first block, a voltage equal to a programming voltage plus a delta voltage, wherein the first block is located on a first plane and has undergone a first number of program-erase cycles, receiving, at a second word line of a second block, the voltage, wherein the second block is located on a second plane and has undergone a second number of program-erase cycles, wherein the second number of program-erase cycles is less than the first number of program-erase cycles, and receiving, at a first bit line, the delta voltage, wherein the first bit line crosses the first word line. At least some of the steps are performed at a shared programming voltage line of the multi-plane programming system.

In an embodiment, zero voltage is received at the second bit line, and the second bit line crosses the second word line.

In an embodiment, the first word line forms a first memory cell with the first bit line, the second word line forms a second memory cell with the second bit line, and based upon the delta voltage applied to the first bit line, a gate-to-channel voltage at the second memory cell is higher than at the first memory cell.

In an embodiment, the delta voltage is based upon the first number of program-erase cycles.

In an embodiment, the delta voltage is directly proportional to the first number of program-erase cycles.

In an embodiment, a first page located on the first block receives a first effective voltage based on the voltage, and a second page that contains the second block receives a second effective voltage based that is greater than the first effective voltage.

In an embodiment, the steps further include, receiving, at a third word line of a third block and a fourth word line of a fourth block, the voltage, wherein the third block is located on a third plane and has undergone a third number of program-erase cycles, and the fourth block is located on a fourth plane and has undergone a fourth number of program-erase cycles, and the second number of program-erase cycles is less than i) the third number of program-erase cycles and ii) the fourth number of program-erase cycles.

According to another aspect of the disclosure, a memory system for performing a programming operation to a multi-plane programming system is provided. The memory system includes a shared programming voltage line. The memory system also includes a memory controller configured to cause the shared programming voltage line to: receive, at a first word line of a first block, a voltage equal to a programming voltage plus a delta voltage, wherein the first block is located on a first plane and has undergone a first number of program-erase cycles, receive, at a second word line of a second block, the voltage, wherein the second block is located on a second plane and has undergone a second number of program-erase cycles, wherein the second number of program-erase cycles is less than the first number of program-erase cycles, receive, at a first bit line, the delta voltage, wherein the first bit line crosses the first word line.

In an embodiment, the memory controller is further configured to cause the shared programming voltage line to receive, at the second bit line, zero voltage, wherein the second bit line crosses the second word line.

In an embodiment, the first word line forms a first memory cell with the first bit line, the second word line forms a second memory cell with the second bit line, and based upon the delta voltage applied to the first bit line, a gate-to-channel voltage at the second memory cell is higher than at the first memory cell.

In an embodiment, the delta voltage is based upon the first number of program-erase cycles.

In an embodiment, the delta voltage is directly proportional to the first number of program-erase cycles.

In an embodiment, a first page located on the first block receives a first effective voltage based on the voltage, and a second page that contains the second block receives a second effective voltage based that is greater than the first effective voltage.

In an embodiment, the memory controller is further configured to: receive, at a third word line of a third block and a fourth word line of a fourth block, the voltage, wherein the third block is located on a third plane and has undergone a third number of program-erase cycles, and the fourth block is located on a fourth plane and has undergone a fourth number of program-erase cycles, and the second number of program-erase cycles is less than i) the third number of program-erase cycles and ii) the fourth number of program-erase cycles.

According to another aspect of the disclosure, a non-volatile memory system is provided. The non-volatile memory system includes a memory controller configured to cause a shared programming voltage line to: receive, at a first word line of a first block, a voltage equal to a programming voltage plus a delta voltage, wherein the first block is located on a first plane and has undergone a first number of program-erase cycles, receive, at a second word line of a second block, the voltage, wherein the second block is located on a second plane and has undergone a second number of program-erase cycles, wherein the second number of program-erase cycles is less than the first number of program-erase cycles, and receive, at a first bit line, the delta voltage, wherein the first bit line crosses the first word line.

In an embodiment, the memory controller is further configured to cause the shared programming voltage line to receive, at the second bit line, zero voltage, wherein the second bit line crosses the second word line.

In an embodiment, the first word line forms a first memory cell with the first bit line, the second word line forms a second memory cell with the second bit line, and based upon the delta voltage applied to the first bit line, a gate-to-channel voltage at the second memory cell is higher than at the first memory cell.

In an embodiment, the delta voltage is based upon the first number of program-erase cycles.

In an embodiment, the delta voltage is directly proportional to the first number of program-erase cycles.

In an embodiment, a first page located on the first block receives a first effective voltage based on the voltage, and a second page that contains the second block receives a second effective voltage based that is greater than the first effective voltage.

In an embodiment, the memory controller is further configured to: receive, at a third word line of a third block and a fourth word line of a fourth block, the voltage, wherein the third block is located on a third plane and has undergone a third number of program-erase cycles, and the fourth block is located on a fourth plane and has undergone a fourth number of program-erase cycles, and the second number of program-erase cycles is less than i) the third number of program-erase cycles and ii) the fourth number of program-erase cycles.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which:

FIG. 11 illustrates a table showing delta voltage applied to the re-linked block based on the cycle number of the existing/old blocks.

DETAILED DESCRIPTION

Figure 1:
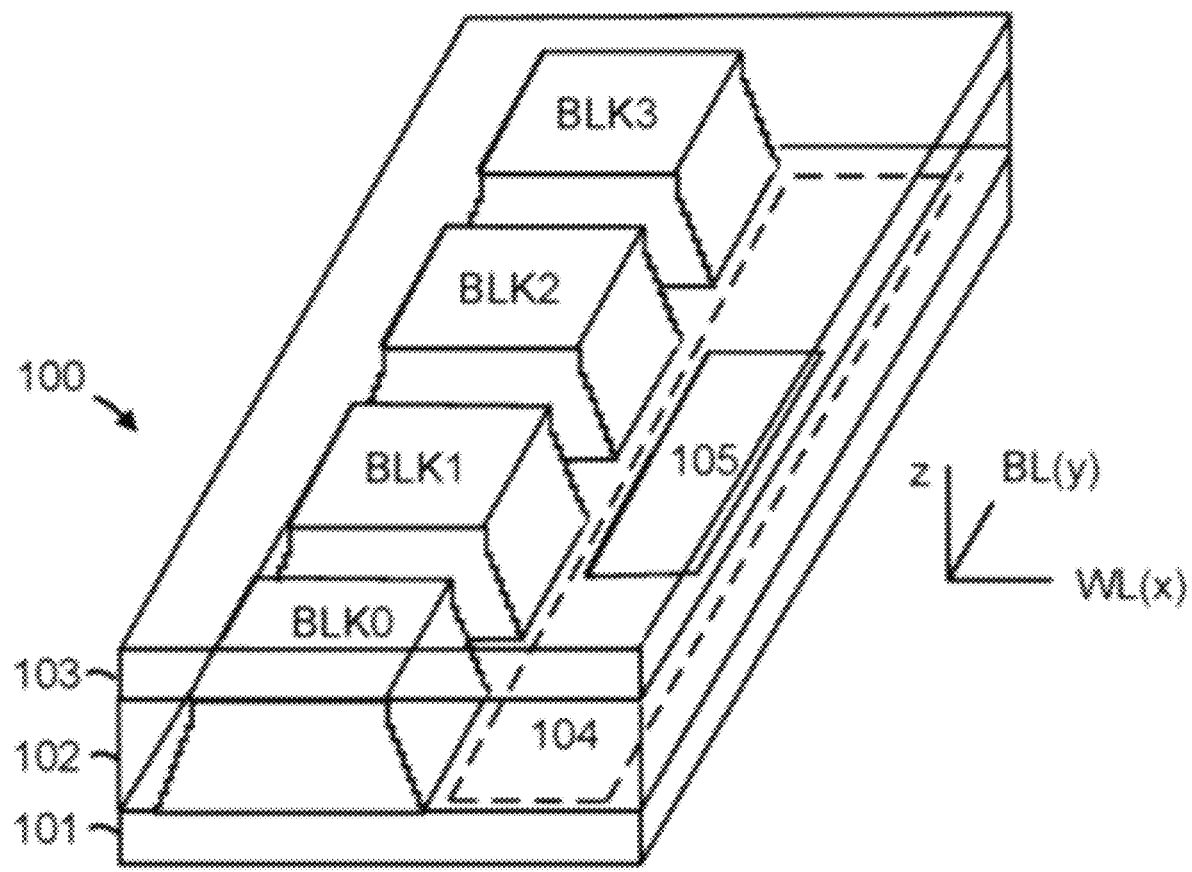
FIG. 1 is a perspective view of an embodiment of a memory device.

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

Techniques described herein are directed to managing program-erase (P/E) cycles in NAND flash memory system that use multi-plane programming. Multi-plane programming operations includes directly programming data to two or more planes (i.e., pages in blocks located on different planes) using one program operation. During each multi-plane programming operation, 16 kilobytes (kb) of data can be programmed to a single plane. Accordingly, 32 kb of data can be programmed using a 2-plane setup, and 64 kb of data can be programmed using a 4-plane setup.

Some NAND flash memory systems can undergo several P/E cycles before reach an end-of-life state. For example, a NAND flash memory system with single-living cell (SLC) NAND structures can undergo up to 100,000 (or 100K) P/E cycles before reaching end-of-life. However, P/E cycles are known to cause damage to the NAND flash memory system, and accordingly, an SLC NAND flash memory system approaching 100K P/E cycles can undergo significant damage. One benefit of increased P/E cycles includes faster programming speed and less programming voltage ($V_{PGM}$). In this regard, a controller (e.g., solid-state drive, or SSD, controller) of the NAND flash memory system can use an adaptive $V_{PGM}$ operation in which the $V_{PGM}$ is reduced based upon the number of P/E cycles.

Additional enhancement improve the overall memory storage performance. For example, a controller in the NAND flash memory system can determine and/or mark/tag when a block is a growing bad block ("GBB"). Subsequently, in a multi-plane programming operation, the controller can replace the GBB with a new or fresh block. While the new block is designed to restore memory storage capability in accordance with a specification, the programming voltage used to perform a P/E cycle to the new block, having undergone little if any P/E cycles, may provide an insufficient $V_{PGM}$, as adaptive $V_{PGM}$ used for the existing blocks is a relatively lower $V_{PGM}$. Without additional modifications, an additional program pulse is required to program the new block.

This disclosure describes techniques to overcome the above-references issues while programming all memory blocks using a single multi-plane programming operation. In some embodiments, the controller of the NAND flash memory can increase the $V_{PGM}$ to a voltage equal to $V_{PGM}$ plus a delta voltage ($\Delta$). This voltage—$V_{PGM}$ plus delta voltage ($\Delta$)—is applied across a shared programming line among pages (and their respective word lines) in different planes. The delta voltage ($\Delta$) provides the additional programming voltage for the new block. As a result, the new block does not require an additional programming pulse.

While the delta voltage ($\Delta$) provides the voltage necessary to program the new block, the existing blocks (in different planes) can become over-programmed based on the delta voltage ($\Delta$). Moreover, multiple planes in a multi-plane programming operation cannot receive different voltages to offset this issue. In order to reduce the effective voltage across memory cells in the existing blocks, the bit lines that form cells with the above-referenced word lines are provided with different voltages. For example, the bit lines in the new block receives zero volts (0 V) while the bit lines in the existing blocks receive a voltage equal to the delta voltage ($\Delta$). As a result, the effective gate-to-channel voltage across the memory cells in the new block is $V_{PGM}+\Delta$ while the effective gate-to-channel voltage across the memory cells in the existing blocks is $V_{PGM}$ (i.e., $V_{PGM}+\Delta-\Delta$). The lower effective gate-to-channel voltage is based upon the bias voltage applied across the bit lines of the existing bit lines. Accordingly, a single programming voltage $V_{PGM}$ can be applied to all planes in a multi-plane programming operation, while simultaneously providing a different effective voltages to different memory cells. In some embodiments, the delta voltage ($\Delta$) is determined based upon the number of P/E cycles. For example, the delta voltage ($\Delta$) can be directly proportional to the number of P/E cycles counts of the existing block(s) and as a result, the delta voltage ($\Delta$) can increase with increasing P/E cycle counts.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electro-magnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as may be used herein, refer to a sequence of instructions that is designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or mores," and/or "ones or mores" according to set theory, unless expressly specified otherwise.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

Technology described herein may be used with a variety of types of non-volatile memory. One example is a three-dimensional (3D) non-volatile memory device. However, embodiments may also be practiced in two-dimensional (2D) non-volatile memory device. FIG. 1 is a perspective view of an embodiment of a memory device 100. In some embodiments, the memory device 100 is set of blocks in a 3D stacked non-volatile memory system. The memory device 100 may also be referred to herein as a non-volatile memory system 100, or more succinctly as memory system 100. The memory device 100 includes a substrate 101. On the substrate 101 are blocks BLK0, BLK1, BLK2 and BLK3 of memory cells (storage elements) and a peripheral area 104 with circuitry for use by the blocks. For example, the circuitry can include voltage drivers 105 which can be connected to control gate layers of the blocks. In one approach, control gate layers at a common height in the blocks are commonly driven. The substrate 101 can also carry circuitry under the blocks, along with one or more lower metal layers which are patterned in conductive paths to carry signals of the circuitry. The blocks are formed in an intermediate region 102 of the memory device 100. In an upper region 103 of the memory device 100, one or more upper metal layers are patterned in conductive paths to carry signals of the circuitry. Each block includes a stacked area of memory cells, where alternating levels of the stack represent control gate layers. In one possible approach, the control gate layers of each block at a common height are connected to one another and to a voltage driver. While four blocks are depicted as an example, two or more blocks can be used, extending in the x- and/or y-directions.

The length of the plane, in the x-direction, may represent a direction in which signal paths to word lines extend in the one or more upper metal layers (e.g., a word line or drain side select gate (SGD) line direction), and the width of the plane, in the y-direction, represents a direction in which signal paths to bit lines extend in the one or more upper metal layers (e.g., a bit line direction). The z-direction represents a height of the memory device 100.

Figure 2:
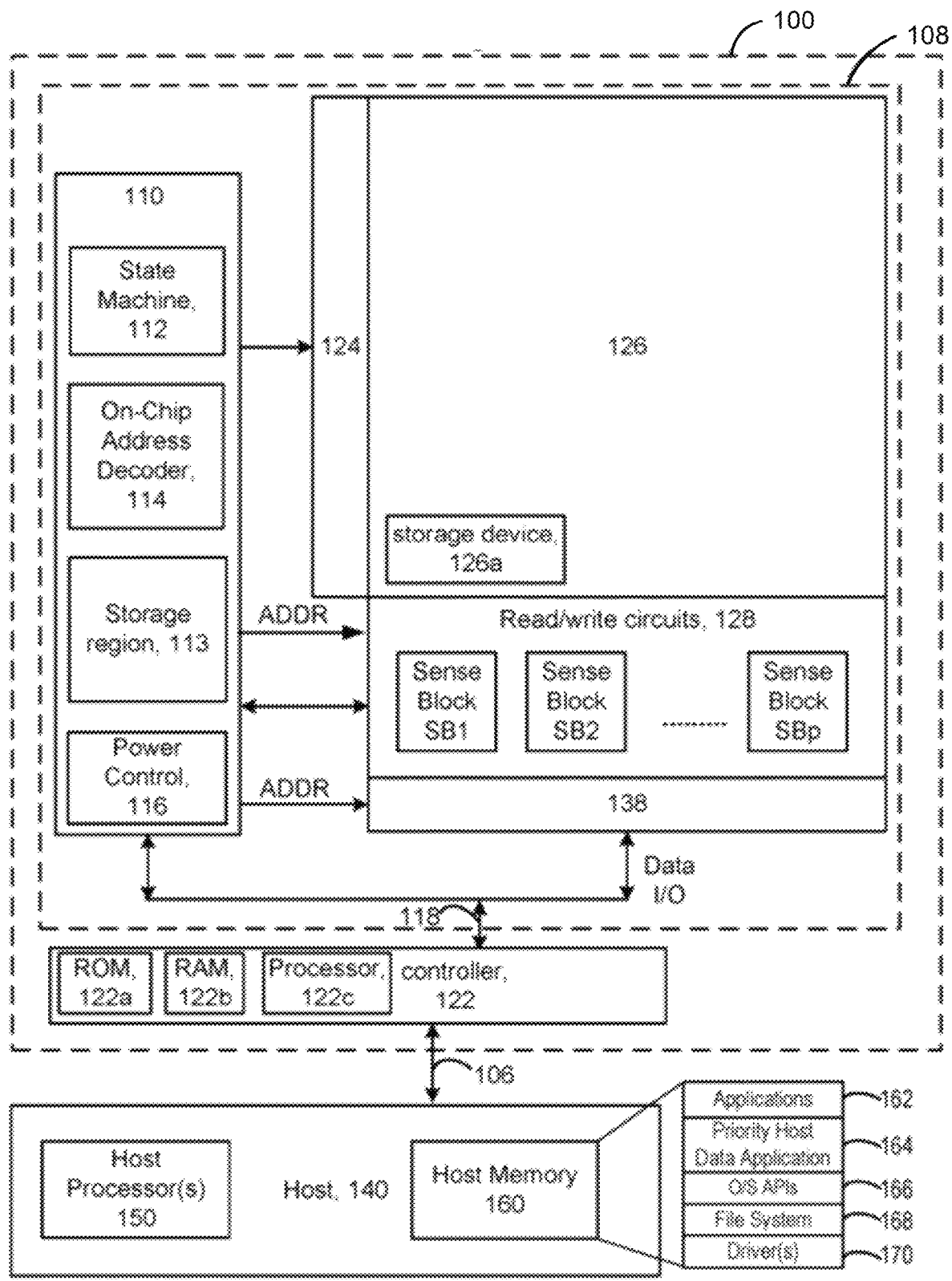
FIG. 2 is a block diagram of a non-volatile memory device, such as the memory device of FIG. 1.

FIG. 2 is a block diagram of a non-volatile memory device, such as the memory device 100 of FIG. 1. The block diagram may also be used for a 2D non-volatile memory device.

In one embodiment, the non-volatile memory system 100 may be a card based system, such as a secure digital (SD) or a micro secure digital (micro-SD) card. In an alternative embodiment, the non-volatile memory system 100 may be part of an embedded non-volatile memory device. For example, the non-volatile memory system 100 may be embedded within a host system 140 (discussed further below), such as in the form of a solid state disk (SSD) drive installed in a personal computer.

The memory device 100 may include memory die 108, which can be composed of one or more memory die. The set of blocks of FIG. 1 can be on memory die 108. The memory die 108 includes a memory structure 126 of memory cells (e.g., an array of memory cells), control circuitry 110, and read/write circuits 128. In a 3D configuration, the memory structure 126 can include the blocks of FIG. 1. The memory structure 126 is addressable by word lines via a row decoder 124 and by bit lines via a column decoder 138. The read/write circuits 128 include multiple sense blocks SB1, SB2, . . . , SBp (sensing circuitry) and allow a page of memory cells to be read or programmed in parallel. Typically, a memory controller 122 (e.g., non-volatile memory controller) is included in the same non-volatile memory device 100 (e.g., a removable storage card) as the memory die 108.

Multiple memory elements in memory structure 126 may be configured so that they are connected in series or so that each element is individually accessible. By way of non-limiting example, flash memory systems in a NAND configuration (NAND memory) typically contain memory elements connected in series. A NAND string is an example of a set of series-connected transistors that include memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

Other types of non-volatile memory in addition to NAND flash memory can also be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase change memory (e.g., PCRAM), and other semiconductor elements capable of storing information. Each type of memory device may include different configurations. For example, flash memory devices may be configured in a NAND or a NOR configuration.

The memory elements can be formed from passive and/or active elements, in any combination. By way of a non-limiting example, passive semiconductor memory elements include ReRAM device elements, which in some embodiments include a resistivity switching storage element, such as an anti-fuse or phase change material, and optionally a steering element, such as a diode or transistor. The phase change material may include a chalcogenide material. One embodiment uses a GeTe—Sb2Te3 super lattice to achieve non-thermal phase changes by changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave. Further by way of a non-limiting example, active semiconductor memory elements include EEPROM and flash memory device elements, which in some embodiments include elements containing a charge storage region, such as a floating gate, conductive nanoparticles, or a charge storage dielectric material.

The memory structure 126 can be two-dimensional ("2D") or three-dimensional ("3D"). The memory structure 126 may include one or more arrays of memory elements (also referred to as memory cells). In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may include a wafer over or in which the layer of the memory elements are formed. Alternatively, the substrate may include a carrier substrate which is attached to the memory elements after they are formed. As a non-limiting example, the substrate may include a semiconductor such as silicon.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

The memory structure 126 may include a monolithic 3D memory structure in which multiple memory levels are formed above (and not in) a single substrate, such as a wafer, with no intervening substrates. The memory structure 126 may include any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of a non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels.

Then again, 2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

One of skill in the art will recognize that this technology is not limited to the 2D and 3D exemplary structures described but covers all relevant memory structures within the spirit and scope of the technology as described herein and as understood by one of skill in the art.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a memory controller for memory read-write operations may be located on a separate controller chip and/or on the same substrate as the memory elements.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided for parameters for operating the memory device 100 such as programming parameters for different rows or other groups of memory cells. These programming parameters could include bit line voltages and verify voltages.

The on-chip address decoder 114 provides an address interface between that used by the host system 140 or a memory controller 122 to the hardware address used by the row decoder 124 and the column decoder 138. The power control module 116 controls the power and voltages supplied to the word lines and bit lines during memory operations. It can include drivers for word line layers (WLLs) in a 3D configuration, SGS and SGD select gates and source lines. In one approach, the sense blocks can include bit line drivers. A source side select gate (SGS) is a gate transistor at a source-end of a NAND string, and a drain side select gate (SGD) is a transistor at a drain-end of a NAND string.

In some implementations, some of the components can be combined. In various designs, one or more of the components (alone or in combination), other than the memory structure 126, can be thought of as one or more control circuits which are configured to perform the actions described herein. For example, one or more control circuits may include any one of, or a combination of, the control circuitry 110, the state machine 112, the on-chip address decoder 114, the row decoder 124, the column decoder 138, the power control module 116, the sense blocks SB1, SB2, . . . , SBp, the read/write circuits 128, the memory controller 122, and so forth.

The memory controller 122 may include storage devices (memory) such as read only memory ("ROM") 122a, random access memory ("RAM") 122b, and a processor 122c. RAM 122b may be, but is not limited to, SRAM and DRAM. The storage devices include code such as a set of instructions, and the processor 122c is operable to execute the set of instructions to provide the functionality described herein. Alternatively or additionally, the processor 122c can access code from a storage device region 126*a* of the memory structure 126, such as a reserved area of memory cells in one or more word lines.

The code is used by the memory controller 122 to access the memory structure 126 for operations such as programming, read and erase operations. The code can include boot code and control code (e.g., a set of instructions). The boot code is software that initializes the memory controller during a booting or startup process and enables the memory controller to access the memory structure. The code can be used by the memory controller 122 to control one or more memory structures. Upon being powered up, the processor 122*c* fetches the boot code from the ROM 122*a* or storage device region 126*a* for execution, and the boot code initializes the system components and loads the control code into the RAM 122*b*. Once the control code is loaded into the RAM 122*b*, it is executed by the processor 122*c*. The control code includes drivers to perform basic tasks such as controlling and allocating memory, prioritizing the processing of instructions, and controlling input and output ports.

The host system 140 is electrically coupled to the memory device 100 by an interface 106 (e.g., data bus). The interface 106 may also be referred to as a communication interface. The host system 140 may include one or more host processors 150 and a host memory 160. The host memory 160 may include, but is not limited to, SRAM and DRAM. Commands and data are transferred between the host system 140 and memory controller 122 via the interface 106, and between the memory controller 122 and the memory die 108 via lines 118.

The interface 106 may include any suitable interface. For example, the interface 106 may include a mechanical and/or electrical connection between the host system 140 and memory device 100. Examples for the interface 106 include, but are not limited to, Secure Digital ("SD"), MultiMedia-Card ("MMC"), embedded MultiMediaCard ("eMMC"), Universal Serial Bus ("USB"), Serial Advanced Technology Attachment ("SATA"), Fibre Channel, Small Computer Systems Interface ("SCSI"), Peripheral Component Interface ("PCI"), and PCI Express ("PCIe"). In some embodiments, the interface 106 includes a Peripheral Component Interconnect Express (PCIe) bus. In some embodiments, the memory device 100 and host system 140 communicate over the PCIe bus using a Non-Volatile Memory Express ("NVMe") protocol. NVMe is a logical device interface that may be used to access non-volatile storage attached when using a PCIe bus between the host system 140 and the memory device 100. However, note that the logical device interface is not limited to NVMe. Other possible logical device interfaces include, but are not limited to, the Advanced Host Controller Interface ("AHCI"), SATA, SATA Express, MMC, eMMC, USB, Serial Attached SCSI ("SAS"), Fibre Channel Protocol ("FCP"), and Universal Flash Storage ("UFS").

The host memory 160 may be used to store applications 162, a priority host data application 164, O/S APIs 166, a file system 168, and one or more device drivers 170. Note that the reference numeral "166" will be used herein to refer both to the O/S APIs in general and a particular O/S API. Note that all or a portion of applications 162, the priority host data application 164, the O/S APIs 166, the file system 168, and the one or more device drivers 170 may be stored in the memory structure 126. Also note that the host memory 160 could include volatile memory, wherein the applications 162, the priority host data application 164, the O/S APIs 166, and the file system 168 are not necessarily maintained in host memory 160 when power is off. The host system 140 may contain boot code to load one or more of the applications 162, priority host data application 164, O/S APIs 166, file system 168, and/or the one or more device drivers 170 from the memory structure 126 into the host memory 160.

Figure 3:
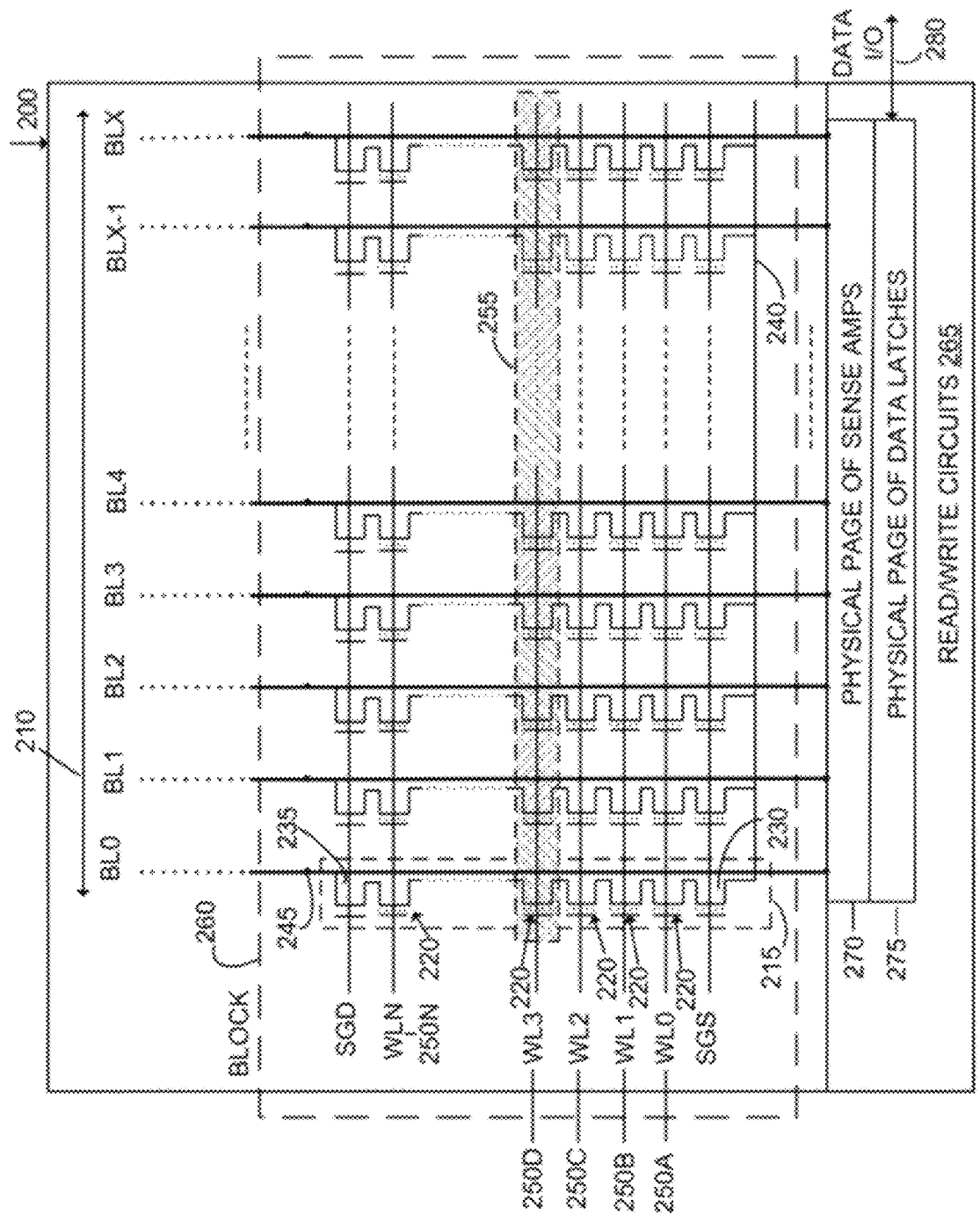
FIG. 3 depicts an example block diagram of a memory module, in accordance with some embodiments of the present disclosure.

FIG. 3 depicts an example block diagram of a memory module 200, in accordance with some embodiments of the present disclosure. The memory module 200 represents a portion (i.e., row) of a block (e.g., blocks BLK0, BLK1, BLK2 and BLK3 shown in FIG. 1). Only certain components of the memory module 200 are shown in FIG. 3. Nevertheless, other components that are needed or considered desirable to have in performing the functions described herein may be provided in or associated with the memory module 200. The memory module 200 may include a NAND memory type. However, in other embodiments, the memory module 200 may be of other memory types, as discussed above. When the memory module 200 is of a NAND memory type, the memory module 200 may include several strings 210, also referred to as NAND strings. For example, a string 215 (surrounded by a dotted line), also referred to as a NAND string, includes several memory cells 220.

Figure 4:
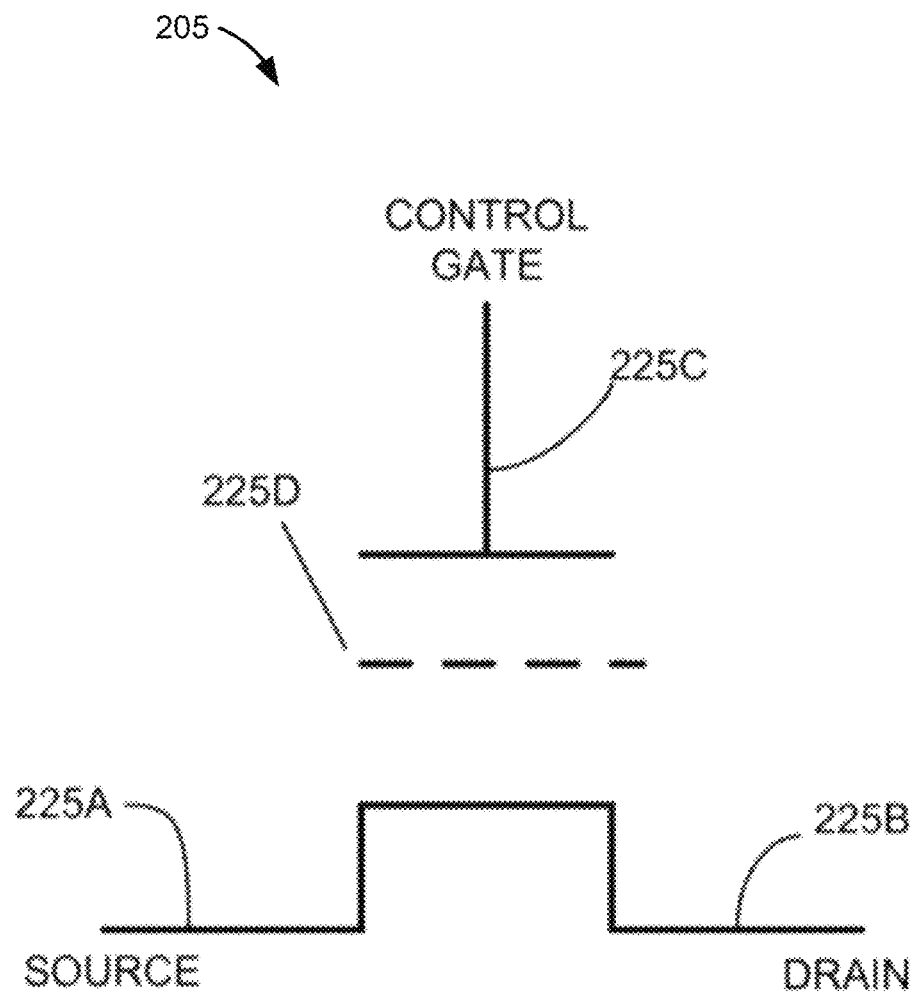
FIG. 4 depicts an example of a memory cell, in accordance with some embodiments of the present disclosure.

FIG. 4 depicts an example of a memory cell 205, in accordance with some embodiments of the present disclosure. As described herein, the memory cell 205 includes features that may also be included for one or more of the memory cells 200 (shown in FIG. 3). For example, in some embodiments, the memory cell 205 may be implemented as a field-effect transistor having a source terminal 225A, a drain terminal 225B, and a control terminal 225C. The memory cell 205 may also include a floating gate 225D configured to store charge. In some embodiments, the floating gate 225D may be insulated to electrically isolate the floating gate and trap the electrical charge therein. Current may flow between the source terminal 225A and the drain terminal 225B under control of the control terminal 225C and the floating gate 225D. In other embodiments, the memory cell 205, and therefore, one or more of the memory cells 220 may be implemented in other ways.

Referring again to FIG. 3, the memory cells 220 in the string 215 may be connected together in a daisy-chained fashion, such that the source terminal of one memory cell is connected to the drain terminal of another memory cell. The number of memory cells forming the memory cells 220 may vary from one embodiment to another. For example, in some embodiments, the number of the memory cells 220 may include four, eight, sixteen, etc. as desired. The string 215 may also include a first select transistor 230 and a second select transistor 235 on either side of the memory cells 220. The first select transistor 230 and the second select transistor 235 may be configured to connect the string 215 to other components of the memory module 200 and/or other components external to the memory module 200. Each of the first select transistor 230 and the second select transistor 235 may be implemented as a field-effect transistor having a source terminal, a drain terminal, and a control terminal. When the control terminal of the first select transistor 230 is turned on by the control terminal thereof, the source terminal of the first select transistor 230 may be connected to a source line 240. Similarly, when the second select transistor 235 is turned on by the control terminal thereof, the drain of the second select transistor may be connected to a bit line 245. By turning on the first select transistor 230 and the second select transistor 235, the string 215 may be selected to perform read, write, or other operations.

Further, the control terminal of each of the memory cells 220 is connected to a respective word line such as word lines 250A-2520N. The word lines 250A-250N may be used to control read and write operations in the string 215 once the string 215 has been selected by the first select transistor 230 and the second select transistor 235. For example, when the string 215 has been selected, an appropriate voltage may be applied via the word line (e.g., one of the word lines 250A-250N) of one of the plurality of memory cells 220 that is desired to be programmed or from which data is to be read. The remaining ones of the memory cells 220 in the string 215 may be turned on by applying a second appropriate voltage at their respective word lines. Thus, by controlling the voltage applied to the first select transistor 230, the second select transistor 235, and the word lines 250A-250N, the string 215 may be operated.

Although only the elements of the string 215 have been described above, it is to be understood that each remaining one of the strings 210 also includes similar elements. Thus, each remaining one of the strings 210 may include several features similar to those described for the string 215 (e.g., memory cells similar to the memory cells 220, the first select transistor 230, the second select transistor 235, the bit line 245, and the word lines 250A-250N).

Additionally, in some embodiments, memory cells of multiple NAND strings may be connected to the same word line forming a row of memory cells. For example, a row 255 may include one of the memory cells 220 from multiple ones of the strings 210. All of the memory cells in the row 255 may be connected to the same word line, such as the word line 250D. By connecting the memory cells in the row 255 to the word line 250D, all of the memory cells forming the row may be programmed or read in parallel. The row 255 may be considered to form a page (indicated by the shaded area in FIG. 3) of the memory module 200. The memory cells forming the row 255 may be programmed/read in parallel by selecting each of the strings 210 that form part of that row 255 using the respective first select transistors and second select transistor of each of those strings, and applying appropriate voltage to the word line 255D, as well as turning on the remaining memory cells of those strings by applying voltages at their respective word lines.

Further, some of the strings 210 may be grouped together to form a "block" of memory cells. For example, the strings 210 may be grouped together to form a block 260. Although all of the strings 210 have been shown as being part of the block 260, in some embodiments, the strings 210 may be grouped together to form multiple blocks. Thus, the memory module 200 may include a single block, as shown in FIG. 3, or multiple blocks. Likewise, although the row 255 is shown as encompassing all of the strings 210, in some embodiments, the row 255 may be divided into multiple rows, with each row being connected to a separate word line.

The memory module 200 may also include read/write circuits 265 that facilitate reading/writing operation in the strings 210. For example, the read/write circuits 265 may include a bank of sense amplifiers 270 and a bank of latches 275 connected to the bit line 245 of each of the strings 210 (i.e., bit lines BL0 through BLX). The bank of sense amplifiers 270 may be used to send data to be programmed within the selected row (e.g., the row 255) to be programmed or receive the data read from the selected row. The bank of latches 275 may be used to temporarily store input-output ("I/O") data 280 to be written into the selected row (e.g., the row 255) or read data to be sent to the I/O data.

Figure 5:
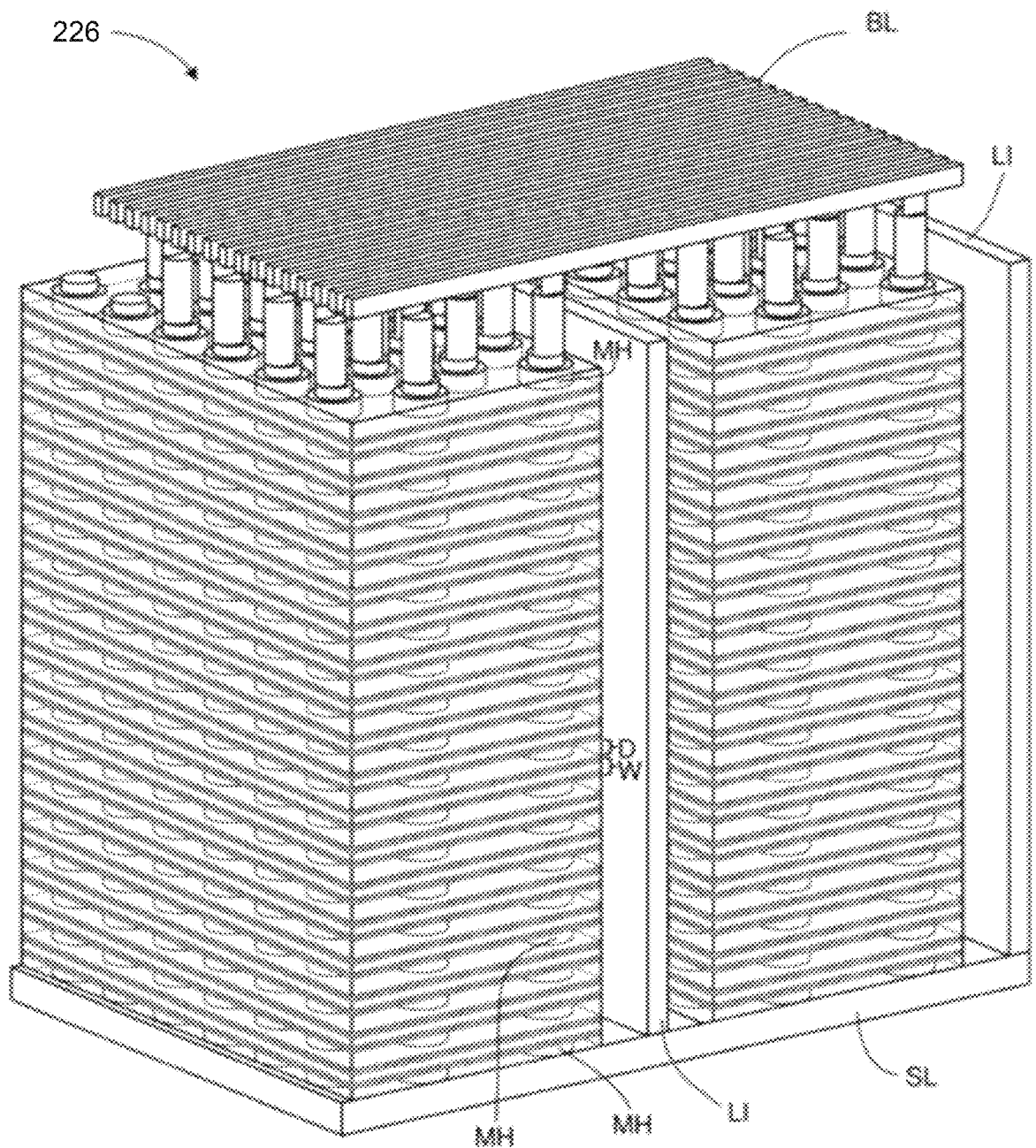
FIG. 5 depicts a perspective view of a portion of one example embodiment of a monolithic 3D memory structure.

FIG. 5 depicts a perspective view of a portion of one example embodiment of a monolithic 3D memory structure 226, which can substitute for the memory structure 126 (shown in FIG. 1). The monolithic 3D memory structure 226 may include several memory cells. For example, FIG. 5 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. The alternating dielectric layers and conductive layers are divided into four "fingers" by local interconnects LI. FIG. 5 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 5, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data.

Figure 6:
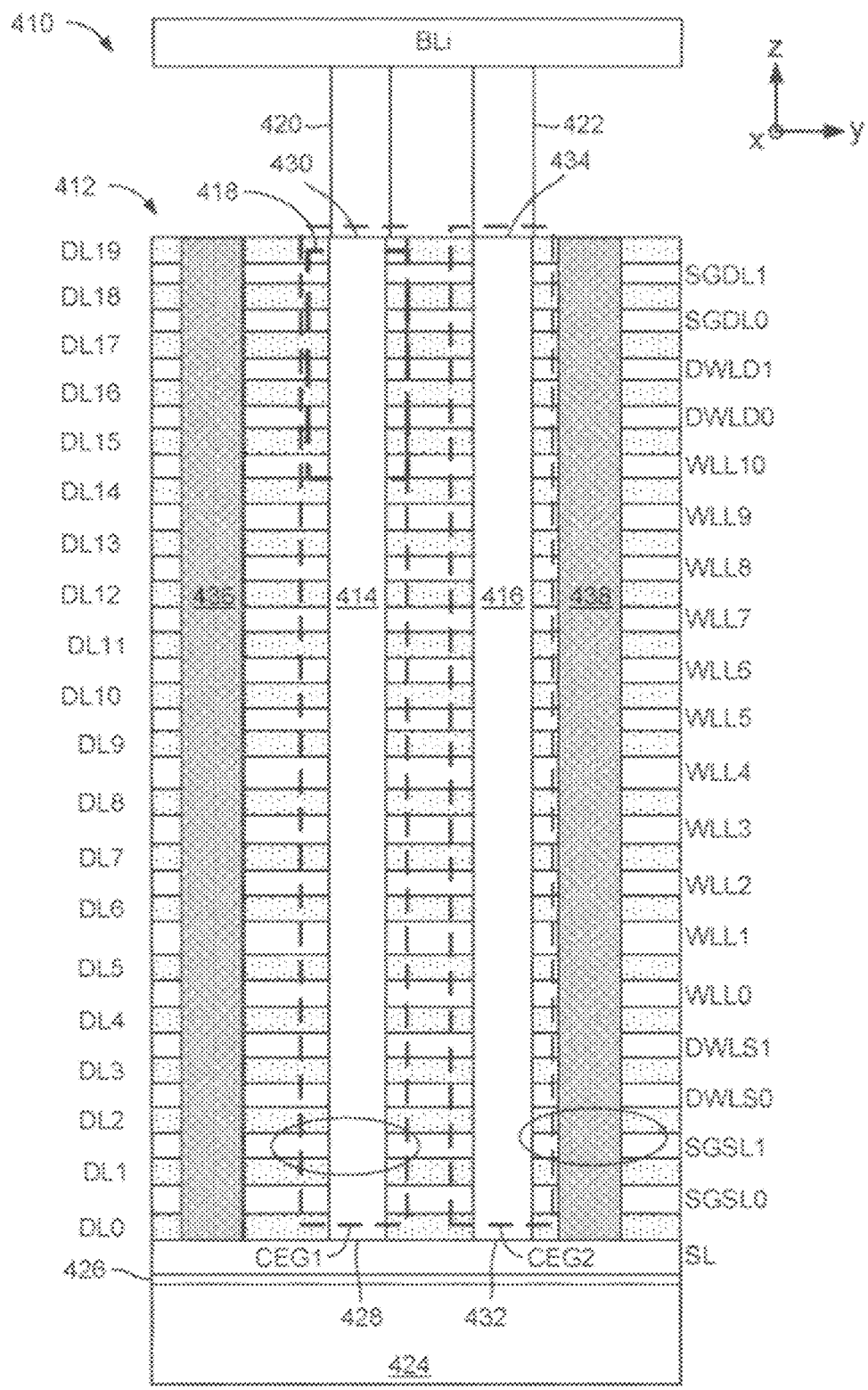
FIG. 6 generally illustrates a cross-sectional view of a portion of a block, which may be representative of one of the blocks of FIG. 1.

FIG. 6 generally illustrates a cross-sectional view of a portion of a block, which may be representative of one of the blocks BLK0-BLK3 of FIG. 1. The block 410 includes a stack 412 of alternating control gate layers and dielectric layers (DL). In addition, the portion generally illustrated in 6 includes two channels (or memory holes) extending through the layers, including a first channel 414 and a second channel 416. Bias elements forming two memory channel element groups around the first channel 414 and the second channel 416 are identified by dotted boxes in FIG. 6. In particular, bias elements forming a first channel element group CEG1 around the first channel 414 are identified by a dotted box labeled CEG1, and bias elements forming a second channel element group CEG2 around the second memory hole 416 are identified by a dotted box labeled CEG2. Further details of bias elements and example materials to form the elements and the channels are described in further detail below with reference to a particular region 418 of the first channel element group CEG1 and the first channel 414.

For purposes of illustration, in FIG. 6, the first and second channel element groups CEG1, CEG2 formed around the first channel 414 and the second channel 416 are both electrically connected to an ith bit line BLi. In actual implementation, a block may include hundreds or thousands of bit lines. An arrangement of channels and associated channel element groups of a block may determine which channels and channel element groups are electrically connected to which bit lines. Among the channels and channel element groups of a block, certain combinations of channels and associated channel element groups are electrically connected to the same bit line as each other, while certain other combinations of channels and associated channel element groups are electrically connected to different bit lines from each other.

In addition, a given channel element group may be electrically connected to a given bit line by way of its associated channel and a conductive via electrically connecting the associated channel with the bit line. For example, in FIG. 6, the first channel element group CEG1 is electrically connected to the ith bit line BLi by way of the first channel 414 and a conductive via 420 that electrically connects the first channel 414 with the ith bit line BLi. The second channel element group CEG2 is electrically connected to the ith bit line BLi by way of the second channel 416 and a conductive via 422 that electrically connects the second channel 416 with the ith bit line BLi. Other ways of electrically connecting bit lines with channel element groups may be possible.

The block 410 may further include or be disposed on a substrate 424. An insulating film 426 may be formed on the substrate 424, and a source line SL may be formed or disposed on a bottom-most layer of the stack 412.

In addition, in the example configuration generally illustrated in FIG. 6, each of the first channel 414 and the second channel 416 includes a source end connected to the source line SL, and a drain end connected to its associated conductive via. Also, the first channel 414 includes a source end 428 connected to the source line SL, and a drain end 430 connected to the conductive via 420. Similarly, the second channel 416 includes a source end 432 connected to the source line SL, and a drain end 434 connected to the conductive via 422.

In addition, at least some example configurations, the block 410 may further include vertical interconnects (e.g., metal-filled slits) extending through the stack 412 that connect the source line SL to a conductive line above the stack 412, such as a conductive line in one of the metal layers in an upper region (e.g., upper region 103 in FIG. 1). For purposes of illustration, FIG. 6 generally illustrates two interconnects 436, 438 extending through the stack 412.

In addition, for purposes of illustration, each of the channel element groups include two SGS transistors, two source-side dummy cells, eleven memory cells, two drain-side dummy cells, and two SGD transistors. Accordingly, the control gate layers of the stack 412 include: two SGS layers, including a first SGS layer SGSL0 and a second SGS layer SGSL1; two source-side dummy word line layers, including a first source-side dummy word line layer DWLS0 and a second source-side dummy word line layer DWLS1; eleven word line layers extending from a first word line layer WLL0 to an eleventh word line layer WLL10; two drain-side dummy word line layers, including a first drain-side dummy word line layer DWLD0 and a second drain-side dummy word line layer DWLD1; and two SGD layers, including a first SGD layer SGS0 and a second SGD layer SGDL1. The stack 412 further includes twenty dielectric layers, extending from a first dielectric layer DL0 to a twentieth dielectric layer DL19, alternatingly disposed between the control gate layers.

The numbers of bias elements and their respective bias element types used for the channel element groups and the number of corresponding control gate layers in the example configuration of the block 410 in FIG. 6 are non-limiting and merely exemplary for purposes of illustration. Other numbers of bias elements for any of the bias element types, or other configurations that do not include bias elements of certain bias elements types or that include one or more bias elements of bias element types other than those generally illustrated in FIG. 6, may be possible.

Figure 7:
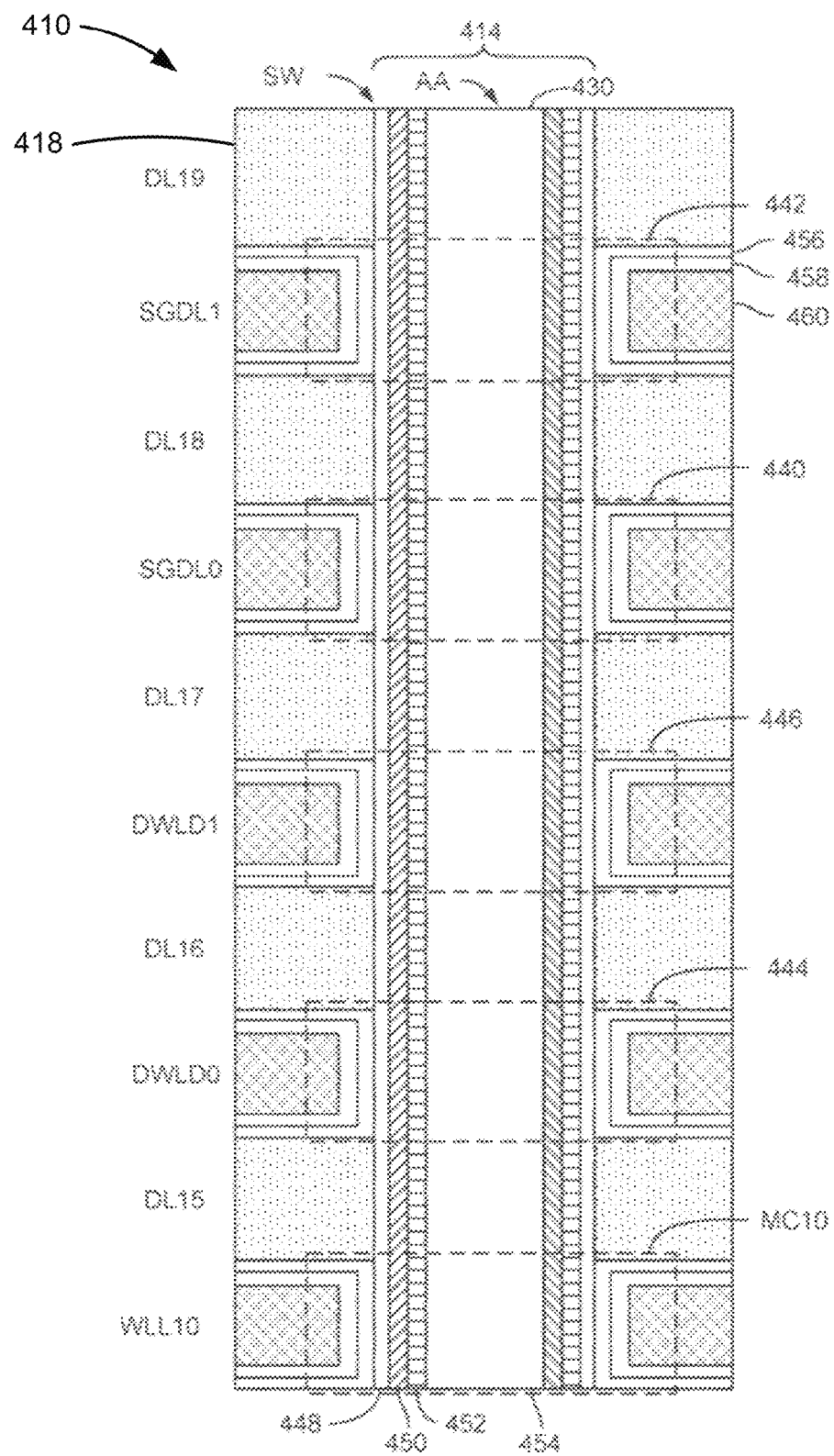
FIG. 7 is a close-up view of a specified region of the block of FIG. 6.

FIG. 7 is a close-up view of the region 418 of the block 410 of FIG. 6. The materials forming the bias elements are formed at different levels of the stack 412 at the intersection of respective control gate layers and respective channels. In the example configuration of the block 410, a first SGD transistor 440 and a second SGD transistor 442 are disposed below the drain end 430 of the first channel 414, and above first and second drain-side dummy cells 444, 446 and an eleventh memory cell MC10.

Physically or structurally, a channel includes a memory hole extending in the z-direction defined by a sidewall (SW). A channel further includes one or more layers of materials disposed in the memory hole and/or on the sidewall, such as by using atomic layer deposition as an example. In some example configurations, as described with respect to the first channel 414, the layers of materials of a channel (which may be referred to as a column or a pillar of materials) may include a charge-trapping layer or film 448 such as silicon nitride, a tunneling layer 450, a polysilicon body or channel 452, and a dielectric core 454. In addition, in some example configurations, such as the one generally illustrated in FIG. 7, the materials making up each of the bias elements may include a blocking oxide/block high-k material 456, a barrier metal 458, and a conductive metal 460 (e.g. Tungsten) that forms the control gates of the transistors. The materials forming the bias elements may be disposed in the same level or in the same plane as the respective control gate layers. Other configurations may use materials deposited along the sidewall (SW) and/or for the bias elements other than those generally illustrated and described with reference to FIG. 7.

Figure 8A:
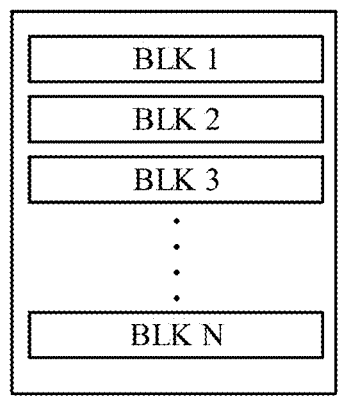
FIG. 8A schematically depicts a memory cell structure.
Figure 8B:
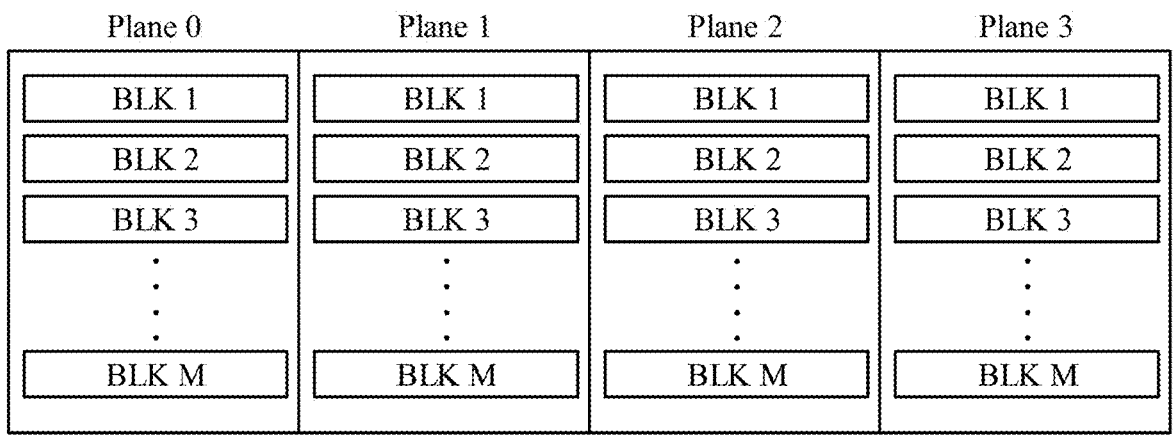
FIG. 8B generally illustrates an example configuration where the blocks are organized into four memory planes.
Figure 8C:
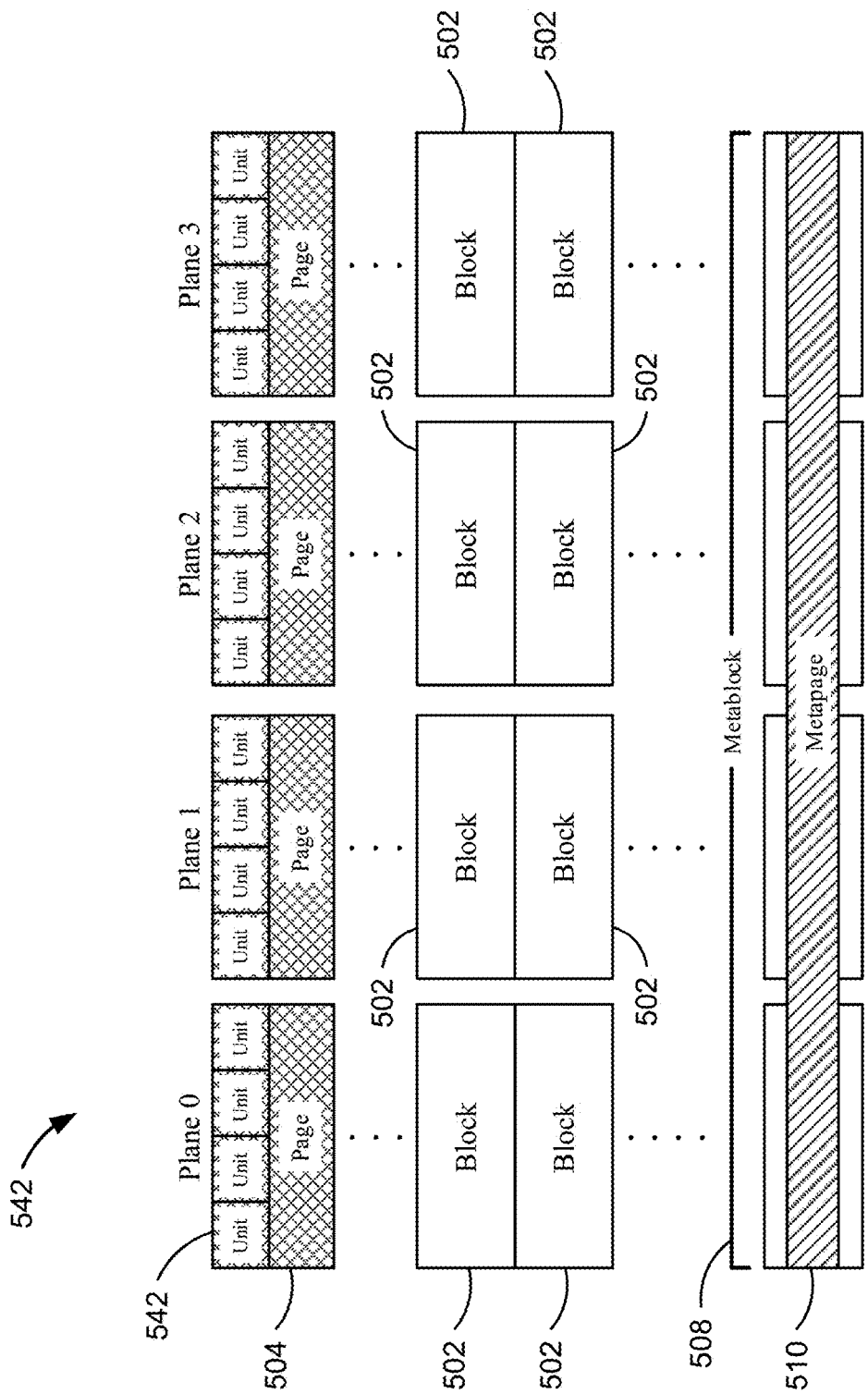
FIG. 8C depicts a block diagram of an example organizational arrangement or hierarchy of a memory cell structure.

FIGS. 8A-8C show and described a memory cell structure 542. The memory cell structure 542 may be located on a memory die (such as the memory die 108 shown in FIG. 2).

FIG. 8A schematically depicts a memory cell structure 542. The memory cell structure 542 may be organized into an N-number of blocks, extending from a first block BLK 1 to an Nth block BLK N. A block is a minimum unit of erase of a memory die. Memory cells that are part of the same block are erased at the same time and/or as part of a same erase operation.

FIG. 8B generally illustrates an example configuration where the blocks are organized into four memory planes, including a first memory plane 0, a second memory plane 1, a third memory plane 2, and a fourth memory plane 3. Configurations with a different number of memory planes (e.g., two memory planes) are possible. As shown, each memory plane includes M-number of blocks, extending from a first block BLK 1 to an Mth block BLK M. In at least some example configurations, blocks that are part of the same plane may be oriented in and/or form a column or a one-dimensional array of blocks, although other configurations of blocks in a single plane may be possible.

FIG. 8C depicts a block diagram of an example organizational arrangement or hierarchy of a memory cell structure 542. The memory cell structure 542 can span multiple memory dies structures spanning multiple memory dies. The memory cell structure 542 may have an organizational arrangement or hierarchy under which data is programmed into, read from, addressed, grouped, or identified in the memory cell structure 542. A controller (e.g., the memory controller 122 in FIG. 2) may be configured to program into, read from, address, group, or identify data in accordance with the organizational arrangement or hierarchy. As described above, memory cells may be divided, or organized into blocks, such as blocks 502, that store blocks of data. A block of data may further be divided into pages, such as pages 504, of data. A page may be a data unit of sensing from the memory cell structure 542 and/or a unit of programming data into the memory cell structure 542. Each individual page may further be divided into segments or units, such as units 306, of data. A segment or unit of data—also referred to as a flash memory unit (FMU), an error correction code ("ECC") page, or a codeword—may include an amount of data that is written at one time during a program operation and/or an amount of data for which parity bits are generated or error corrected by an ECC module during a single parity bit generation or an error correction process.

Additionally or alternatively, the organizational arrangement or hierarchy may include meta-blocks 508 and meta-pages 510. A meta-block address or number identifying a meta-block may be mapped to and/or correspond to a logical address (e.g., a logical group number) provided by a host. Meta-blocks 508 and meta-pages 510 may span or be distributed across a respective single block and page in a single plane, or alternatively, may span or be distributed across respective multiple blocks and multiple pages across multiple planes. FIG. 8C generally illustrates the meta-blocks 508 and the meta-pages 510 spanning across four planes, Plane 0, Plane 1, Plane 2, and Plane 3. Depending on the organizational arrangement, meta-blocks 508 and meta-pages 510 spanning across multiple planes may span across only those planes of a single memory die, or alternatively may span across multiple planes located of multiple memory dies.

In addition, the memory cells of a block may be arranged two-dimensionally in a 2D memory array or three-dimensionally in a 3D memory array. A 2D block is a block that has memory cells arranged two-dimensionally. A 3D block is a block that has memory cells arranged three-dimensionally.

During regular use, a memory structure may experience a GBB. In other words, a block may become faulty or bad. The SSD controller (i.e., memory controller) of the memory system can mark the block accordingly, and subsequently avoid programming operations to faulty block. Further, when the faulty block is part of a meta-block/meta-page arrangement spanning across a multi-plane (or meta-plane) memory system, the multi-plane programming can no longer rely on the faulty block. However, the SSD controller is designed to replace the faulty block.

Figure 9:
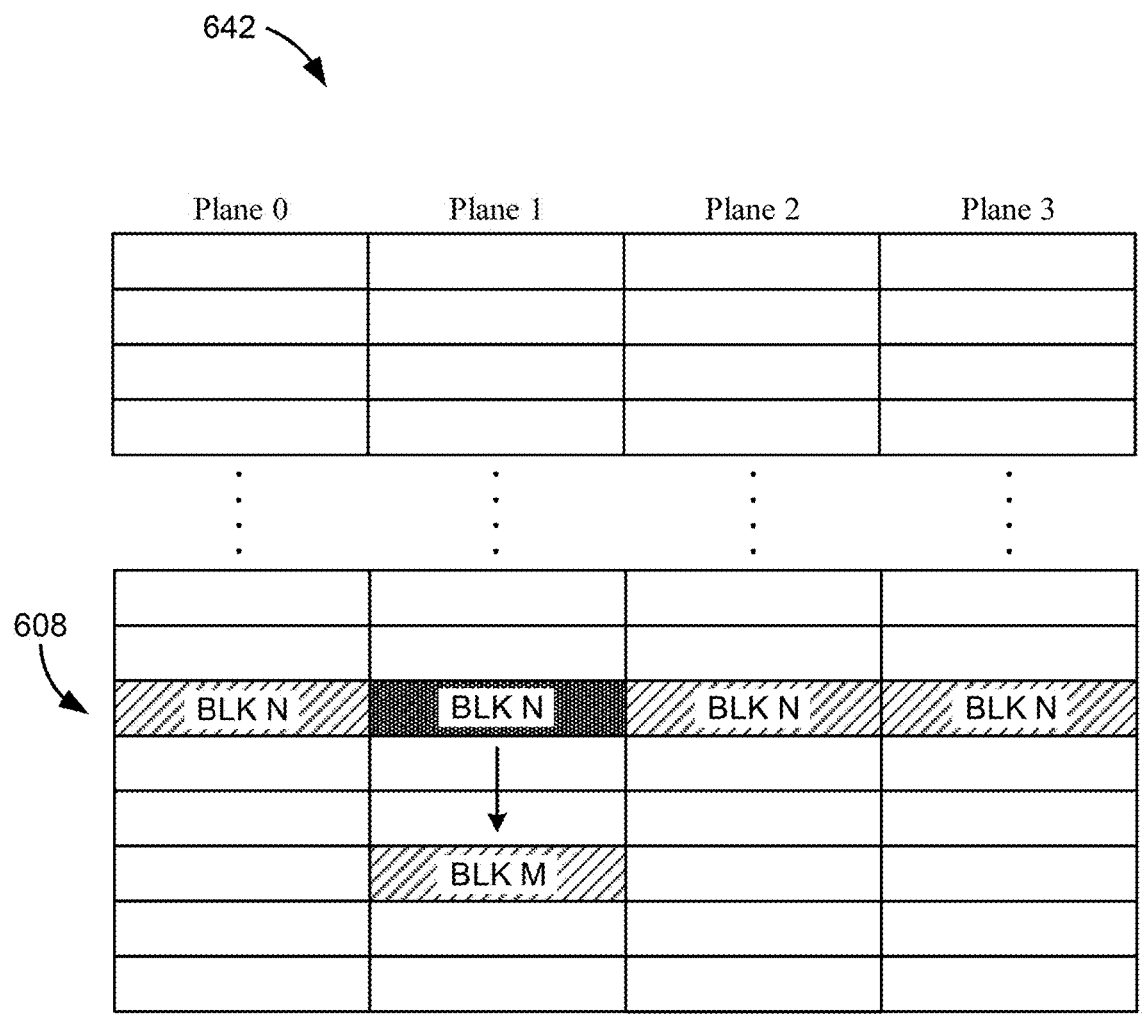
FIG. 9 schematically depicts a memory cell structure organized into four memory planes, showing a re-linked block in a multi-plane programming operation.

FIG. 9 schematically depicts a memory cell structure 642 organized into four memory planes, showing a re-linked block in a multi-plane programming operation. As shown the, memory cell structure 642 includes a first memory plane 0, a second memory plane 1, a third memory plane 2, and a fourth memory plane 3. Initially, a meta-block 608 includes a block in each of Planes 0 through 3. However, a block BLK N in Plane 1 is marked/tagged as faulty. When this occurs, an SSD controller (not shown in FIG. 9) can replace the block BLK N with a new or fresh block, block BLK M. In other words, the block BLK M can be-relinked with the meta-block 608, and the memory cell structure 642 may again providing multi-plane programming in accordance with a specification.

While programming capabilities can be restored using the re-linking process, other issues may occur. For example, memory cells in the respective blocks (BLK N's) in Plane 0, Plane 2, and Plane 3 may have undergone a significant number of P/E cycles, such as 50K to 90K P/E cycles (as a non-limiting range) for a NAND flash memory system using SLC technology. Conversely, the block BLK M, a new block, in Plane 1 has not initially undergone any P/E cycles. Due in part to programming speed increasing with an increasing number of P/E cycles, a disparate programming speed exists between block BLK M in Plane 1 and the respective blocks (BLK N's) in Plane 0, Plane 2, and Plane 3. Moreover, the required programming voltage $V_{PGM}$ decreases with increasing programming speed. In this regard, while an SSD controller can adopt adaptive $V_{PGM}$ and reduce the programming voltage, the resultant voltage may be insufficient to program block BLK M, resulting in under-programming. Conversely, if adaptive $V_{PGM}$ is not adopted, then the blocks BLK N's in Plane 0, Plane 2, and Plane 3 will be over-programmed.

Figure 10:
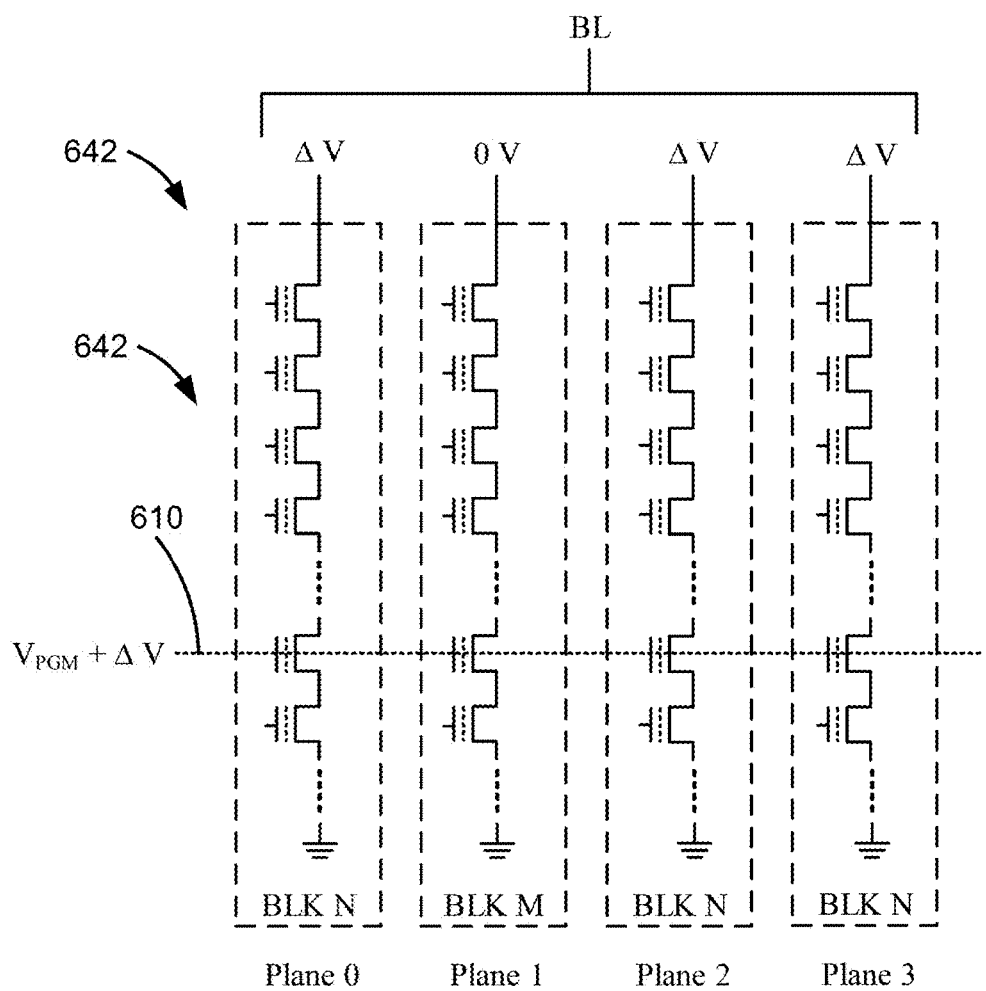
FIG. 10 depicts a schematic diagram showing the memory cell structure during a programming operation.

Certain modifications may be implemented to overcome these issues. For example, FIG. 10 depicts a schematic diagram showing the memory cell structure 642 during a programming operation. As shown, the meta-block 608 can receive a voltage greater than $V_{PGM}$. For example, the meta-block 608 can receive a voltage equal to $V_{PGM}$+a delta voltage (Δ). The voltage $V_{PGM}$+Δ can be applied across a shared programming line 610 connected to multiple word lines in each block of the meta-block 608. As a result, the memory cells in the meta-block can receiving a voltage of $V_{PGM}$+Δ during a programming operation. The additional delta voltage Δ provide additional voltage sufficient to program memory cells in the block BLK M (re-linked block) in Plane 1, this block requires the additional voltage due to being a new block. Further, in order to prevent over-programming of the memory cells in the existing blocks—blocks BLK N's—of Plane 0, Plane 2, and Plane 3, a bias voltage equal to the delta voltage Δ can be applied to the respective bit lines of blocks BLK N's in Plane 0, Plane 2, and Plane 3. However, no bias voltage (V=0) is applied to the bit lines of blocks BLK M in Plane 1. By doing this, the gate-to-channel voltage at the memory cells of block BLK M in Plane 1 is equal to $V_{PGM}$ A, while the effective gate-to-channel voltage at the memory cells of blocks BLK N's in Plane 0, Plane 2, and Plane 3 is equal to $V_{PGM}$. As a result, the memory cells in BLK M are sufficiently programmed (i.e., not under-programmed) while the memory cells in blocks BLK N's are not over-programmed. By using a verify process, the SSD controller can confirm the aforementioned blocks are programmed in desired manner during a single program operation.

FIG. 11 illustrates a table 750 showing delta voltage Δ applied to the re-linked block based on the cycle number (i.e. P/E cycle counts) of the existing/old blocks. The table 750 is based upon an SLC NAND structures, and may be adapted for other NAND structure technology. As shown, the delta voltage Δ increases with increasing P/E cycle counts, and accordingly, the delta voltage D is directly proportional to P/E cycle counts. For example, when the P/E cycle count for existing blocks is 50K, the voltage Δ is 0.5 V, and when the P/E cycle count for existing blocks is 90K, the voltage Δ is 0.9 V. The table 750 shows the delta voltage increasing 0.1 V for every 10K P/E cycle count, and accordingly, the relationship is 0.00001 V per P/E cycle count. Moreover, the table 750 shows that the delta voltage Δ is linear with respect to the P/E cycle counts. However, other non-linear relationships are possible.

Figure 12:
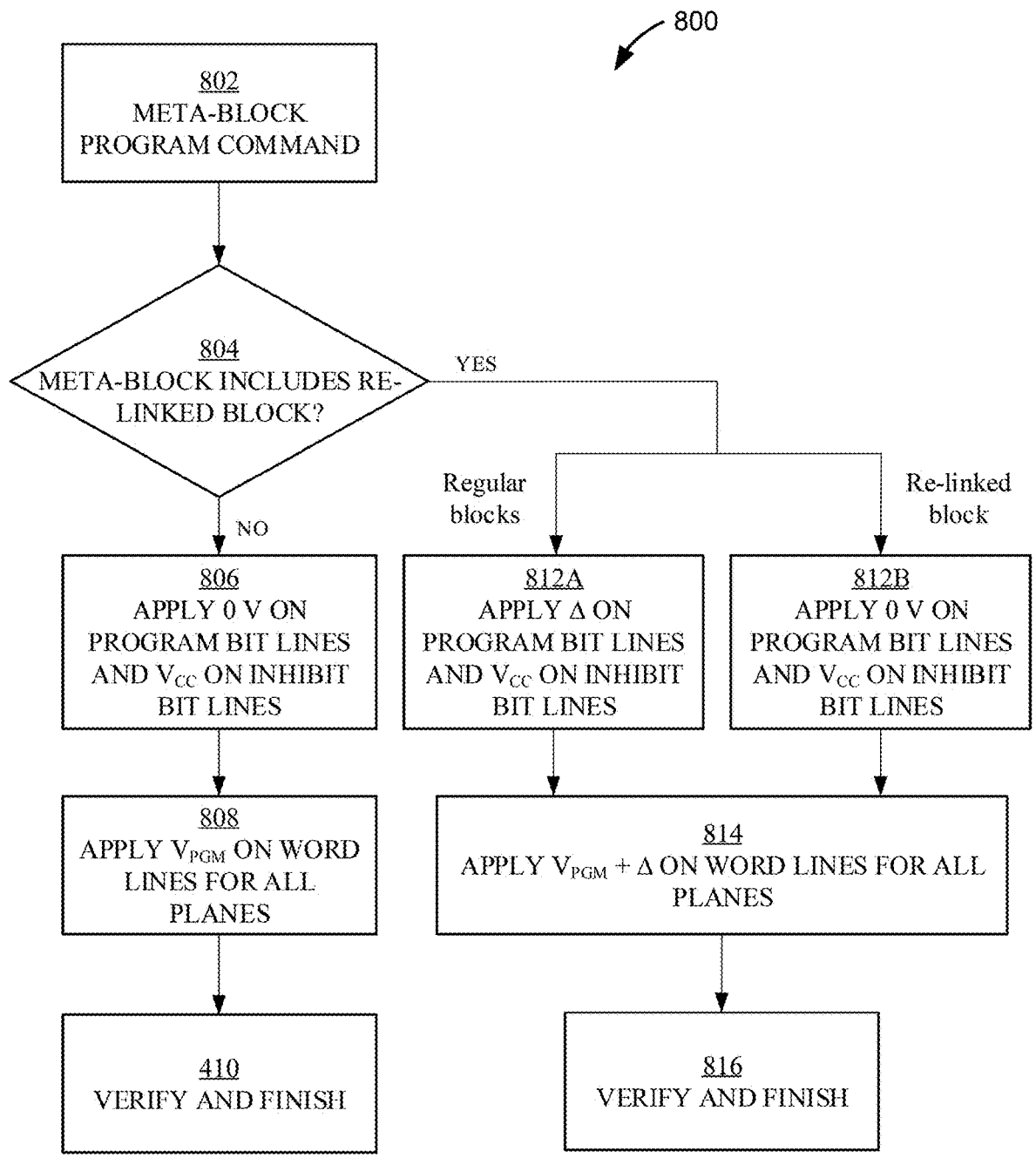
FIG. 12 depicts a process generally illustrating the steps for performing a programming operation to a multi-plane system.

FIG. 12 depicts a process 800 generally illustrating the steps for performing a programming operation to a multi-plane system. As an example, the process 800 can be applied to a programming operation in which a meta-block (meta-page) programming technique includes a re-linked block, as described above. Accordingly, the process 800 can be used when a differential P/E cycle count exists between existing (old) blocks and a re-linked (new or fresh) block.

At step 802, a meta-block program command is initiated. That may be done by, for example, an SSD controller.

At step 804, a decision is made whether the meta-block program includes a re-linked block. When there is no re-linked block, the process 800 proceeds to step 806.

At step 806, 0 V (zero volts) is applied to the program bit lines and a chip supply $V_{CC}$ is applied to the inhibit bit line.

A voltage (e.g., 1 V to 2.5 V) is applied to the inhibit bit line in order to prevent unwanted programming of certain memory cells.

At step 808, a programming voltage $V_{PGM}$ is applied on the word lines of all planes. The program voltage $V_{PGM}$ may vary. For example, in some embodiments, the program voltage $V_{PGM}$ is in the range of 13 to 15 V.

At step 810, a verify process occurs to confirm the memory cells are properly programmed and the process 800 is finished.

When there is re-linked block, the process 800 proceeds to steps 812A and 812B. At step 812A, the existing (old) blocks receive a delta voltage $\Delta$ on the program bit lines and $V_{CC}$ on the inhibit bit lines. At step 812B, the re-linked (new) block receives 0 V on the program bit lines and $V_{CC}$ on the inhibit bit lines.

At step 814, a voltage $V_{PGM}+\Delta$ is applied to word lines for all planes. As an example, the voltage $V_{PGM}+\Delta$ is to a shared programming line that links the respective word lines.

Referring to steps 812A and 814, the delta voltage $\Delta$ is determined using a table, such as the table 750 (shown in FIG. 13). The SDD controller may retrieve the table on stored memory, such as DRAM or SRAM. Additionally, the SSD controller can retriever the P/E cycle count for the existing blocks, then use the table to determine the delta voltage $\Delta$ based on the P/E cycle count.

At step 816, a verify process occurs to confirm the memory cells are properly programmed and the process 800 is finished.

The above discussion is meant to be illustrative of the principles and various embodiments of the present invention. Numerous variations and modifications will become apparent to those skilled in the art once the above disclosure is fully appreciated, and may be employed without departing from the scope of the disclosure, limited only by any practical limitations related to the materials and physical principles of the devices that are described. It is intended that the following claims be interpreted to embrace all such variations and modifications.

What is claimed is:

1. A method for performing a programming operation in a multi-plane programming system, the method comprising:
   receiving, at a first word line of a first block, a voltage equal to a programming voltage plus a delta voltage, wherein the first block is located in a first plane and has undergone a first number of program-erase cycles, and
   receiving, at a second word line of a second block, the voltage, wherein the second block is located in a second plane and has undergone a second number of program-erase cycles, wherein the second number of program-erase cycles is less than the first number of program-erase cycles; and
   receiving, at a first bit line, the delta voltage, wherein the first bit line crosses the first word line, and wherein the delta voltage is based upon the first number of program-erase cycles.

2. The method according to claim 1, further comprising receiving, at a second bit line, zero voltage, wherein the second bit line crosses the second word line.

3. The method according to claim 2, wherein:
   a first memory cell is provided where the first word line and the first bit line cross,
   a second memory cell is provided where the second word line and the second bit line cross, and
   based upon the delta voltage applied to the first bit line, a gate-to-channel voltage at the second memory cell is higher than that at the first memory cell.

4. The method according to claim 1, wherein the delta voltage is directly proportional to the first number of program-erase cycles.

5. The method according to claim 1, wherein:
   a first page located in the first block receives a first effective voltage based on the voltage, and
   a second page located in the second block receives a second effective voltage that is greater than the first effective voltage.

6. The method according to claim 5, further comprising:
   receiving, at a third word line of a third block and a fourth word line of a fourth block, the voltage, wherein:
     the third block is located in a third plane and has undergone a third number of program-erase cycles, and
     the fourth block is located in a fourth plane and has undergone a fourth number of program-erase cycles, and
     the second number of program-erase cycles is less than
       i) the third number of program-erase cycles and ii) the fourth number of program-erase cycles.

7. A memory system for performing a programming operation in a multi-plane programming system, the memory system comprising:
   a memory controller configured to cause a shared programming voltage line to:
     receive, at a first word line of a first block, a voltage equal to a programming voltage plus a positive delta voltage, wherein the first block is located in a first plane and has undergone a first number of program-erase cycles;
     receive, at a second word line of a second block, the voltage, wherein the second block is located in a second plane and has undergone a second number of program-erase cycles, wherein the second number of program-erase cycles is less than the first number of program-erase cycles; and
     receive, at a first bit line, the positive delta voltage, wherein the first bit line crosses the first word line.

8. The memory system according to claim 7, wherein the memory controller is further configured to cause the shared programming voltage line to receive, at a second bit line, zero voltage, wherein the second bit line crosses the second word line.

9. The memory system according to claim 8, wherein:
   a first memory cell is provided where the first word line and the first bit line cross,
   a second memory cell is provided where the second word line and the second bit line cross, and
   based upon the delta voltage applied to the first bit line, a gate-to-channel voltage at the second memory cell is higher than that at the first memory cell.

10. The memory system according to claim 7, wherein the positive delta voltage is based upon the first number of program-erase cycles.

11. The memory system according to claim 10, wherein the positive delta voltage is directly proportional to the first number of program-erase cycles.

12. The memory system according to claim 7, wherein:
   a first page located on the first block receives a first effective voltage based on the voltage, and
   a second page located in the second block receives a second effective voltage that is greater than the first effective voltage.

13. The memory system according to claim 12, wherein the memory controller is further configured to:

receive, at a third word line of a third block and a fourth word line of a fourth block, the voltage, wherein:

the third block is located in a third plane and has undergone a third number of program-erase cycles, and the fourth block is located in a fourth plane and has undergone a fourth number of program-erase cycles, and the second number of program-erase cycles is less than i) the third number of program-erase cycles and ii) the fourth number of program-erase cycles.

14. A non-volatile memory system, comprising:

a first block and a second block;

a memory controller configured to:

apply, at a first word line of the first block, a voltage equal to a programming voltage plus a delta voltage, wherein the first block is located in a first plane and has undergone a first number of program-erase cycles;

apply, at a second word line of the second block, the voltage, wherein the second block is located in a second plane and has undergone a second number of program-erase cycles, wherein the second number of program-erase cycles is less than the first number of program-erase cycles; and apply, at a first bit line, the delta voltage, wherein the first bit line crosses the first word line, and wherein the delta voltage is based on the first number of program-erase cycles.

15. The non-volatile memory system according to claim 14, wherein the memory controller is further configured to cause a shared programming voltage line to receive, at the second bit line, zero voltage, wherein the second bit line crosses the second word line.

16. The non-volatile memory system according to claim 15, wherein:

a first memory cell is provided where the first word line and the first bit line cross, a second memory cell is provided where the second word line and the second bit line cross, and based upon the delta voltage applied to the first bit line, a gate-to-channel voltage at the second memory cell is higher than that at the first memory cell.

17. The non-volatile memory system according to claim 14, wherein:

a first page located in the first block receives a first effective voltage based on the voltage, and a second page located in the second block receives a second effective voltage that is greater than the first effective voltage.

18. The non-volatile memory system according to claim 17, wherein the memory controller is further configured to cause a shared programming voltage line to:

receive, at a third word line of a third block and a fourth word line of a fourth block, the voltage, wherein:

the third block is located in a third plane and has undergone a third number of program-erase cycles, and the fourth block is located in a fourth plane and has undergone a fourth number of program-erase cycles, and the second number of program-erase cycles is less than i) the third number of program-erase cycles and ii) the fourth number of program-erase cycles.

* * * * *